United States Patent [19]

Ruth

[11] Patent Number: 4,830,020

[45] Date of Patent: May 16, 1989

[54] MEASUREMENT SIGNAL INTERFERENCE ELIMINATION

[75] Inventor: Bernhard Ruth, Garching, Fed. Rep. of Germany

[73] Assignee: Gesellschaft für Strahlen-und Umweltforschung mbH, Neuherberg, Fed. Rep. of Germany

[21] Appl. No.: 10,791

[22] Filed: Feb. 4, 1987

[30] Foreign Application Priority Data

Feb. 6, 1986 [DE] Fed. Rep. of Germany ....... 3603673

[51] Int. Cl.$^4$ .............................................. A61B 5/02
[52] U.S. Cl. ..................................... 128/691; 128/901
[58] Field of Search ............... 364/724, 733, 825, 829; 455/303, 306, 307, 308; 128/691, 696, 901, 697, 710, 419 PT

[56] References Cited

U.S. PATENT DOCUMENTS

| | | | |
|---|---|---|---|
| 3,651,318 | 3/1972 | Czekajewski | 128/691 |
| 4,243,045 | 1/1981 | Maas | 128/696 |
| 4,587,662 | 5/1986 | Langewellpott | 455/303 |
| 4,635,298 | 1/1987 | Kage et al. | 455/303 |
| 4,664,116 | 5/1987 | Shaya et al. | 128/697 |

Primary Examiner—Francis Jaworski
Assistant Examiner—George Manuel
Attorney, Agent, or Firm—Spencer & Frank

[57] ABSTRACT

A method for indicating the value of a time varying measurement signal which may contain interference that would lead to a systematic error in the value indication, the method including: providing a representation of the measurement signal; providing a representation of a threshold value with respect to which the representation of the measurement signal has a given polarity when interference is present in the measurement signal; identifying each time period during which the measurement signal representation has the given polarity relative to the threshold value representation; and producing an indication of the value which the measurement signal has outside of each identified time period.

11 Claims, 7 Drawing Sheets

MEASUREMENT SIGNAL INTERFERENCE ELIMINATION

BACKGROUND OF THE INVENTION

The present invention relates to a method for eliminating interference in a measurement signal which contains so much noise that it is necessary to smooth it to obtain the measured value, where the interference includes elements which would lead to a systematic error in the formation of the measured value.

In particular, the present invention relates to a method and a circuit arrangement with which interference in measurement signals can be detected on the basis of the time behavior of the interference and such interference can thus be suitably considered when a measured value is formed from the measurement signal, for example for the determination of blood circulation in the skin.

Analog measurement signals are subject to interference from very different causes. Systematic errors unilaterally change a measured value and are thus difficult to detect and estimate.

Statistical interference, or noise, can be reduced or completely eliminated by integration over time. However, it must then be assumed that the measured value remains unchanged during time intervals corresponding to the magnitude of the time constant employed. Generally, the constancy over time of a measured value imposes a limit on the value of the time constant, and thus limits the measuring accuracy. Reduction of statistical errors by integration over time is, as a practical matter, the result of a limit frequency being introduced into the spectrum of the measurement signal. The components above the limit frequency are considered interference and are eliminated by a frequency filter. The separation between interference and the instantaneous measured value is thus made on the basis of spectral characteristics.

However, separation with the aid of a frequency filter presupposes that the interference results in changes in the measurement signal, with the frequency and amplitude of such changes being distributed symmetrically around the true measured value.

However, often this is not the case. If, for example, a measurement signal containing a considerable amount of noise, which must therefore be filtered through a lowpass filter and which has a relatively slowly changing average, occurs together with comparatively short interferences which exclusively increase, or decrease the magnitude of the instantaneous measurement signal by a substantial amount, the measured value obtained by integration over time is systematically increased, or decreased. Thus, in this case, integration over time results in an additional systematic error which can no longer be detected due to the integration and lowpass filtering, respectively.

Equivalent interferences also occur in a digital signal which is formed, for example, of a sequence of unit pulses and in which the measurement signal corresponds to the rate of the unit pulses. An example is the measurement of light intensity by means of a photomultiplier which is operated as photon counter. The occurring counting rate for the photon pulses is proportional to the light intensity. Particularly for the determination of low intensities, which is possible only with long measuring interval lengths, there occur a whole series of interferences. One type of interference is characterized by the fact that additional unit pulses are generated in a relatively small time interval and thus the counting rate is systematically increased. This of course falsifies the measured value for the light intensity to be measured. The cause of such so-called "bursts" is electromagnetic interference, cosmic radiation and radioactivity in the environment (specifically K-40 in the glass of the photomultiplier).

For measurements at low counting rates it is therefore necessary to operate, in addition to the measurement photomultiplier, an identical second control photomultiplier equipped with photon counting electronic system on which no light impinges. Occurrence of a burst in the control photomultiplier indicates interference. Further processing of the pulses from the measurement photomultiplier is then interrupted.

Particularly when such bursts are caused by cosmic radiation, there arises the difficulty that the control photomultiplier should really be located at the same place as the measurement photomultiplier. This is accomplished in that the actual measuring photomultiplier is surrounded by a plurality of control photomultipliers and then, if there is coincidence in the control photomultipliers, further processing of pulses from the measuring photomultiplier is interrupted. Consequently, this process is very expensive.

A further possibility of reducing the influence of the bursts is to disable the counter for a certain time interval after it records a pulse, i.e to provide an extended dead time. This would cause pulses appearing in rapid succession to not be registered. However, since the duration of a burst may lie several orders of magnitude above the average time interval between two successive photon pulses, the dead time must either be made too long or interference pulses would again be recorded at the end of the dead time and would likewise falsify the measured value.

Analog signals may also be subject to interference in that relatively high amplitude values occur within relatively short time intervals.

A measurement signal of this type occurs, for example, in a device disclosed in earlier FRG patent applications OS No. 3,242,771 and OS No. 3,401,535. Here, a laser optical method is employed to measure blood circulation in the skin. Since, however, the major portion of the laser light is scattered at the epidermis, through which no blood flows, and does not penetrate to the depth of the layers in which there is circulation, two signals are superposed on one another, these signals being derived, respectively, from: the movement of the blood; and that of the epidermis. Originally, the signal from the movement of the epidermis is predominant. This influence can be reduced by various measures but it cannot be suppressed completely.

Figure 7:
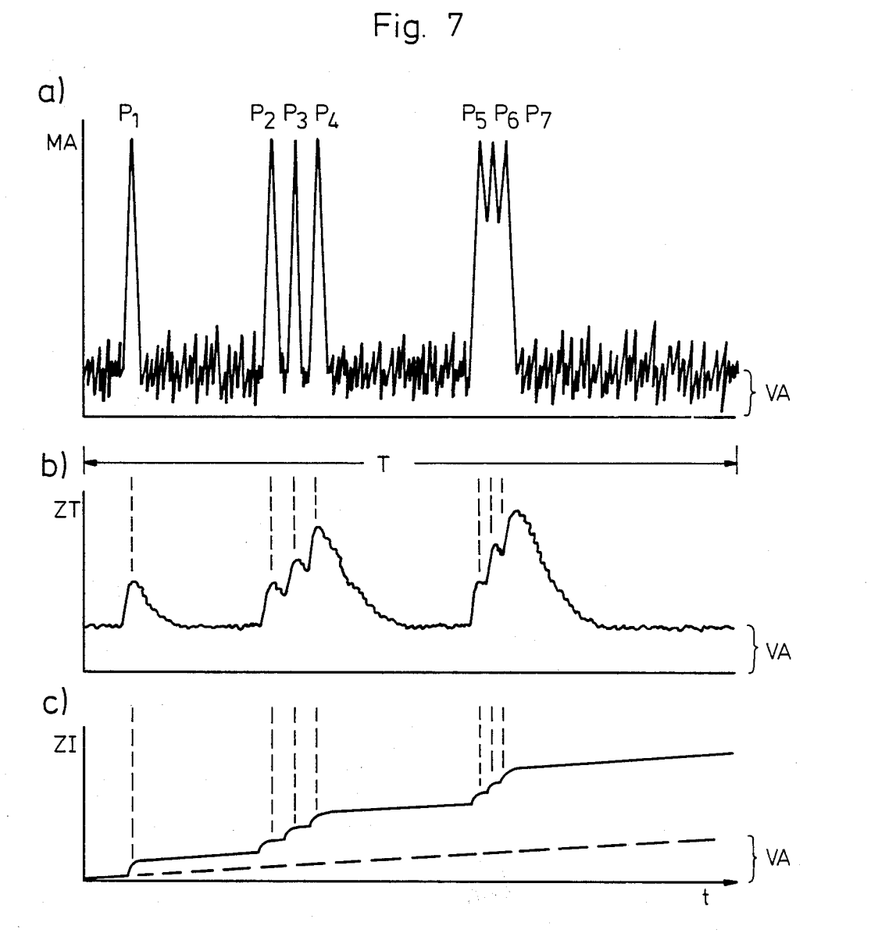

Such a signal is shown in FIG. 7a of the accompanying drawing, where blood circulation through the skin (value VA) changes only slowly so that it can be considered to be constant within the scope of the discussion here. The noise superposed on this blood circulation value is caused primarily by the speckle structure on which the measurement is based, as well as, inter alia, by the laser and the electronic system.

The occurring peaks $P_1$ to $P_7$ are caused in that there is intentional or unintentional movement of the skin at the point of measurement. These are sometimes brief twitches. Particularly patients suffering from circulatory malfunctions in the extremities, where measurements of blood circulation in the skin are made, are afflicted with so-called test pains which they can alleviate by intentional or unintentional twitching.

To reduce noise, the signal MA can be filtered through a lowpass filter. The time constant of the lowpass filter must be dimensioned such that the occurring frequencies in the noise are noticeably attenuated. Since the spectrum of the interference pulses lies in the same frequency range, a modified signal ZT appears at the output of the lowpass filter, as shown in FIG. 7b. The noise is visibly reduced but the interference, due to its magnitude, cause the resulting signal to rise rapidly and decay slowly according to the time constant. If the time constant is increased, the rise at the occurrence of interference is less steep but the time until the signal returns to the level of the measured value becomes longer. In the example given here, an overly high value is indicated during a considerable portion of a measurement interval having a duration T.

Another possibility of reducing the noise is the integration of MA with corresponding time constants during a measuring interval of a length T. This also does not eliminate the interference but causes it to form steps in the curve ZI shown in FIG. 7c. The errors are summed so that at the end of the measuring interval, a value is indicated which is excessive compared to the actually measured value. The broken line in FIG. 7c shows the form which curve ZI would have if no interference occurred.

SUMMARY OF THE INVENTION

It is an object of the present invention to eliminate measuring errors caused by events not specific for the measured value in the determination of a measured value from measurement signals affected by statistical and systematic errors.

The above and other objects are achieved, according to the invention, by a method for indicating the value of a time varying measurement signal which may contain interference that would lead to a systematic error in the value indication, which method includes:
providing a representation of the measurement signal;
providing a representation of a threshold value with respect to which the representation of the measurement signal has a given polarity when interference is present in the measurement signal;
identifying each time period during which the measurement signal representation has the given polarity relative to the threshold value representation; and
producing an indication of the value which the measurement signal has outside of each identified time period.

BRIEF DESCRIPTION OF THE DRAWING

FIGS. 3a–g are waveform diagrams illustrating the signals present at specified points in the circuit of FIG. 2.

FIGS. 5a–g are waveform diagrams illustrating the signals present at specified points in the circuit of FIG. 4.

FIGS. 7a–7c are waveform diagrams illustrative of the prior art.

FIGS. 9a–9e are waveform diagrams illustrating the signals present at specified points in the circuit of FIG. 8.

DESCRIPTION OF THE PREFERRED EMBODIMENTS

Figures 1, 2:
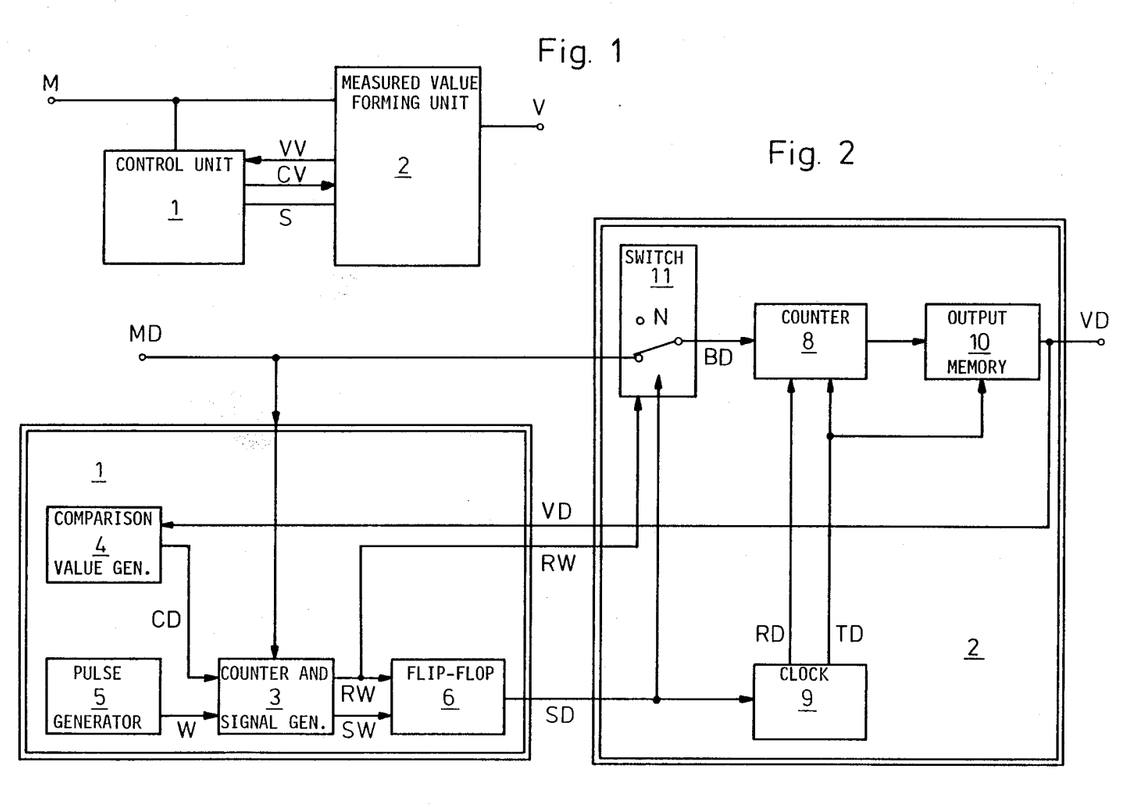
FIG. 1 is a block circuit diagram showing the basic structure of a circuit for carrying out the invention.
FIG. 2 is a block circuit diagram of an embodiment of a digital circuit for carrying out the invention.

The method according to the present invention utilizes other properties of the time behavior of interference events for their detection and consideration in the formation of the measured value. FIG. 1 shows the basic structure of a circuit arrangement for implementing the method which is suitable for digital or analog applications.

The advantage of the invention is that interference is detected in a measurement signal full of noise which, for evaluation, must definitely be smoothed and which contains additional interference which would result in systematic and unilateral falsification of the measurement signal in the formation of the measured value and such interference is considered in the formation of the measured value so that, with simultaneous suppression of the noise, no systematic falsification of the measured value results.

Practical circuit embodiments can be realized with simple electronic components and can be used over a broad frequency range.

On the basis of empirical values, the measurement signal M (digital or analog) is examined for the presence or absence of interference in a control unit 1.

The criteria for such a decision may either be given entirely from external sources or may be determined by the unit itself on the basis of externally given data obtained from the prior behavior of the measurement signal, or may be fixed with the aid of a signal VV from measured value forming unit 2. If interference is present, unit 1 generates a logic signal S which is further processed by subsequent units.

The conversion of the measurement signal M to a measured value V is effected in measured value forming unit 2. This is an arrangement which is able to form a measured value V from the existing measurement signal M on the basis of the requirements (VD digital or VA analog) but is able to interrupt this process on the basis of a logic signal S and continue it at the end of the interruption without an additional error being caused by the duration of the interruption. Generally, unit 2 is composed of an average value forming arrangement and a second time checking arrangement. Both arrangements are constructed to interrupt their operation reversibly on the basis of a logic signal. Possibly, unit 2 requires information from unit 1 about certain parameters, as indicated by signal CV in FIG. 1.

There now follows a description of a digital electronic circuit which, according to FIG. 1, detects interference (bursts) without requiring a second photomultiplier. The circuit is shown in FIG. 2 and various signal waveforms and counter states are shown in FIGS. 3a to 3g.

Control unit 1 serves to detect interference that creates bursts. To do this, unit 1 determines the time difference between two successive photon pulses in measurement signal MD and interference is detected when the time difference between two successive photon pulses falls below a fixed minimum in MD. This minimum is defined by a lower threshold value CD.

Figure 3:
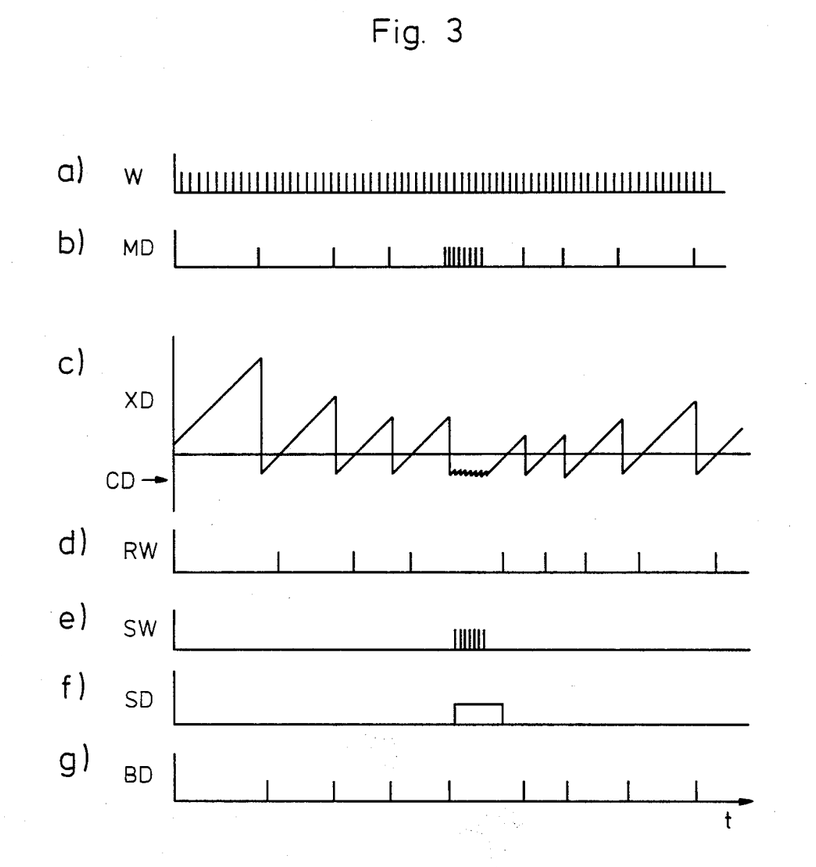

Pulse Generator 5:

Its purpose: generation of pulses W (FIG. 3a) with an adjustable counting rate which is greater by at least one, and preferably at least two, orders of magnitude than the maximum anticipated counting rate for measurement signal MD (FIG. 3b).

Pulse generator 5 generates the clock pulses which are used to measure the time difference between successive photon pulses.

Unit 3 - Counter and Signal Generator:

Unit 3 counts pulses W (FIG. 3a) from pulse generator 5 beginning with the negative value CD (see FIG. 3c) stored in unit 4. If the counter content XD (FIG. 3c) becomes positive, unit 3 sends a logic pulse RW (FIG. 3d) to unit 6. Each counting process is terminated when the next pulse MD arrives at unit 3. If the counter content is negative when a pulse MD arrives, a logic pulse SW (FIG. 3e) is sent to unit 6. If the counter content is positive, no pulse SW is generated. Upon arrival of each pulse MD the value CD from unit 4 is fed to the counter and counting of pulses W begins anew.

Memory Unit of Flip-Flop 6:

Purpose: if a pulse RW arrives, output SD is set to equal 0. No interference was detected. Further pulses RW do not change this setting. This state remains in effect until a logic pulse SW sets output SD to equal 1, i.e. interference exists. Further pulses SW do not change SD (FIG. 3f).

Generator 4 For Generating Comparison Value CD:

Purpose: comparison value CD (FIG. 3c) represents the time difference, measured in units of pulses W from pulse generator 5, which is to be compared with the time difference between two immediately succeeding pulses of measurement signal MD. If the pulses arrive faster than indicated by CD, they are considered to be due to interference.

If the counting rate of measurement signal MD is constant, CD can be set according to an empirical value. If the counting rate is a function of time, CD must be adapted to this counting rate. This can be done, for example, in that the cleaned up counting rates (measured value VD) from memory 10 are stored in unit 4 and the average time between the pulses in the measurement signal is determined from the last n values of VD (n = 1, ... and being adjustable). CD is then set to represent an adjustable fraction of this average time period.

In this case, VD corresponds to the return report VV of FIG. 1.

Unit 2 forms the measured value VD by counting all pulses MD in which there is no interference during a selected time interval.

Unit 8: Counter

This unit counts the pulses BD, where BD=MD in the case of no interference. Each time a logic signal TD is present, the counting process is terminated and the existing counter content is transferred to unit 10 (memory) without interference. Logic signal RD causes counter 8 to be reset to zero.

Unit 10: Memory

Unit 10 stores the content of counter 8 upon the occurrence of a signal TD and makes that content available during the next following measuring interval as an output signal VD for display or further processing.

Clock 9:

Clock 9 permits setting of the length of the measuring intervals. At the end of a measuring interval it generates control signals TD and RD at a time sequence which assures the correct transfer of data from counter 8 to memory 10. First the signal TD is generated which stops the counting process in counter 8 and enables memory 10 to accept the contents of the counter. When this is accomplished TD is reset and the signal RD is generated which causes counter 8 to be set to zero.

If a signal SD =1 is present, the time interval being measured by clock 9 is interrupted and is resumed when SD=0. If the task as hand requires that a constant time difference exist between the beginnings of successive measuring intervals, the clock must record the sum of the interference times. At the end of the fixed time interval, this value must then be considered in a suitable manner in the actual formation of the measured value.

Switch 11:

Purpose: in its simplest embodiment, switch 11 conducts signal MD to the input of counter 8 (BD =MD). If signal SD=1 is present, switch 11 connects the input of counter 8 to ground (BD=0). The output signal BD is shown in FIG. 3g, with the interference pulses removed out. If the counting rates are low and interference occurs frequently, a more complicated solution is required. Transfer of a pulse MD is delayed until a decision has been made as to whether SD=1 applies or not. Only then is the pulse forwarded to switch 11 and from there to the counter, or is not transferred if SD=1.

For this purpose, switch unit 11 requires information regarding the minimum time difference RW which is decisive for the duration of the pulse delay. Signal RW thus corresponds to signal CV in FIG. 1.

Figure 8:
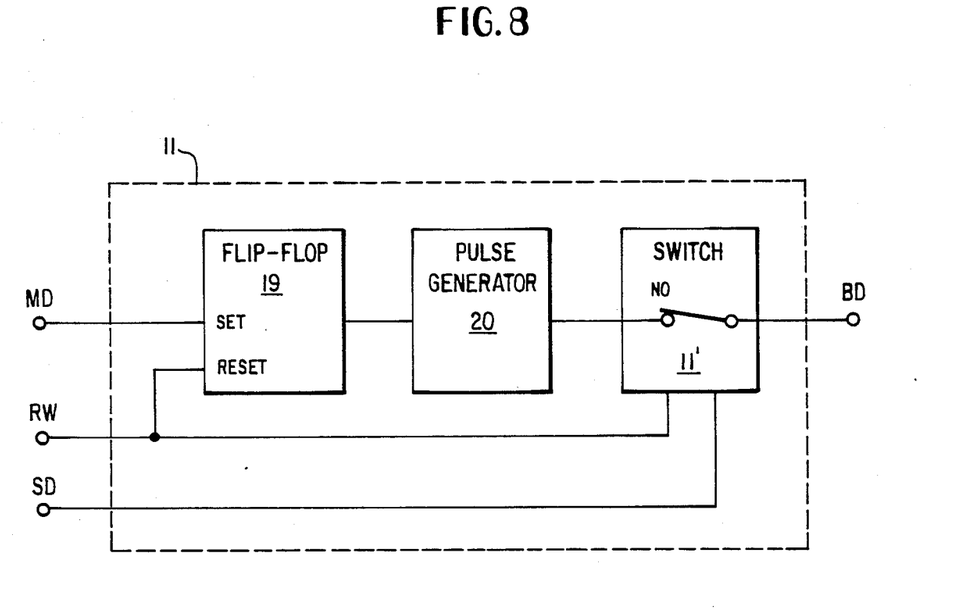
FIG. 8 is a block circuit diagram of an embodiment of the switch unit 11 of FIG. 2.
Figure 9:
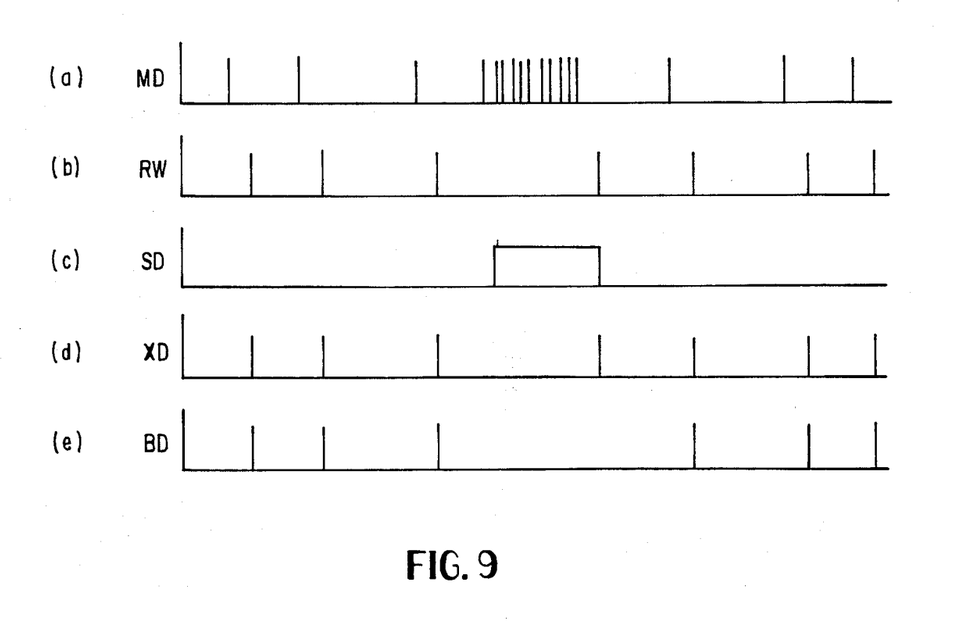

One example for carrying out this procedure in unit 11 is shown in FIG. 8 and accompanying FIG. 9. As shown, signal MD (FIG. 9a) sets a further flip-flop 19 to logical value 1. When the signal RW (FIG. 9b) arrives, the flip-flop 19 is reset to zero, causing a further pulse XD (FIG. 9d), which has a delay relative to MD, to be generated by a generator 20. In the meantime a decision is made and the switch 11' is set to the appropriate position by the signal SD (FIG. 9c). Now signal XD is passed or stopped by the switch 11' corresponding to the absence or presence of interference as determined by signal SD.

The advantage of the method according to the invention comes to bear in this embodiment particularly for measurements of very low light intensities. It suppresses the influence of bursts which may last very much longer than the average time between two successive photon pulses without it being necessary to extend the dead time for recording the photon pulses.

Figure 4:
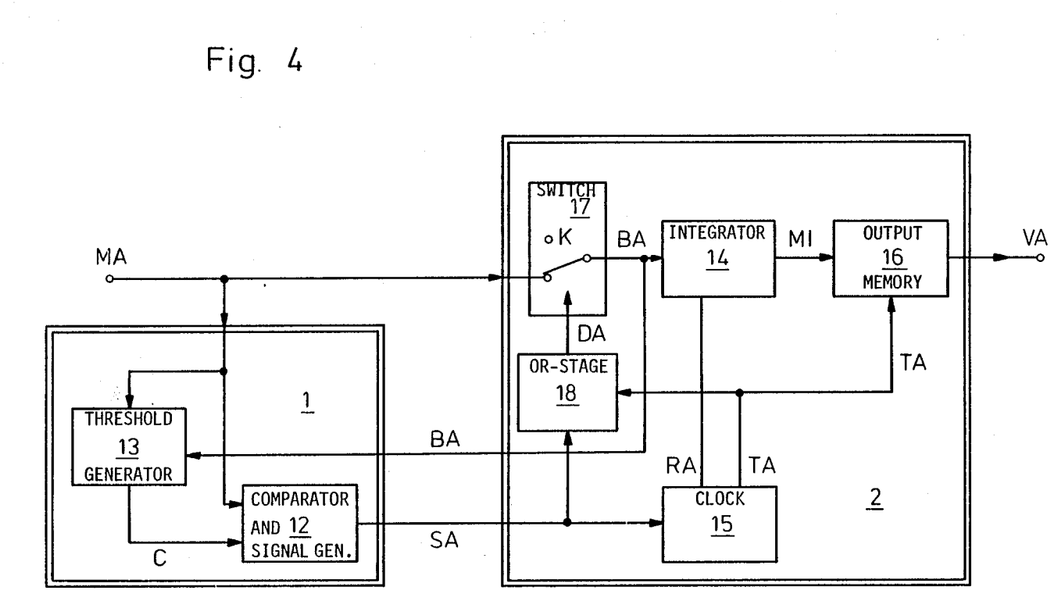
FIG. 4 is a block circuit diagram of an embodiment of an analog circuit for carrying out the invention.

With analog signals, interference is detected and the measured value is formed according to the circuit arrangement of FIG. 4 and the signal curves shown in FIGS. 5a to 5g and FIG. 6.

Figure 5:
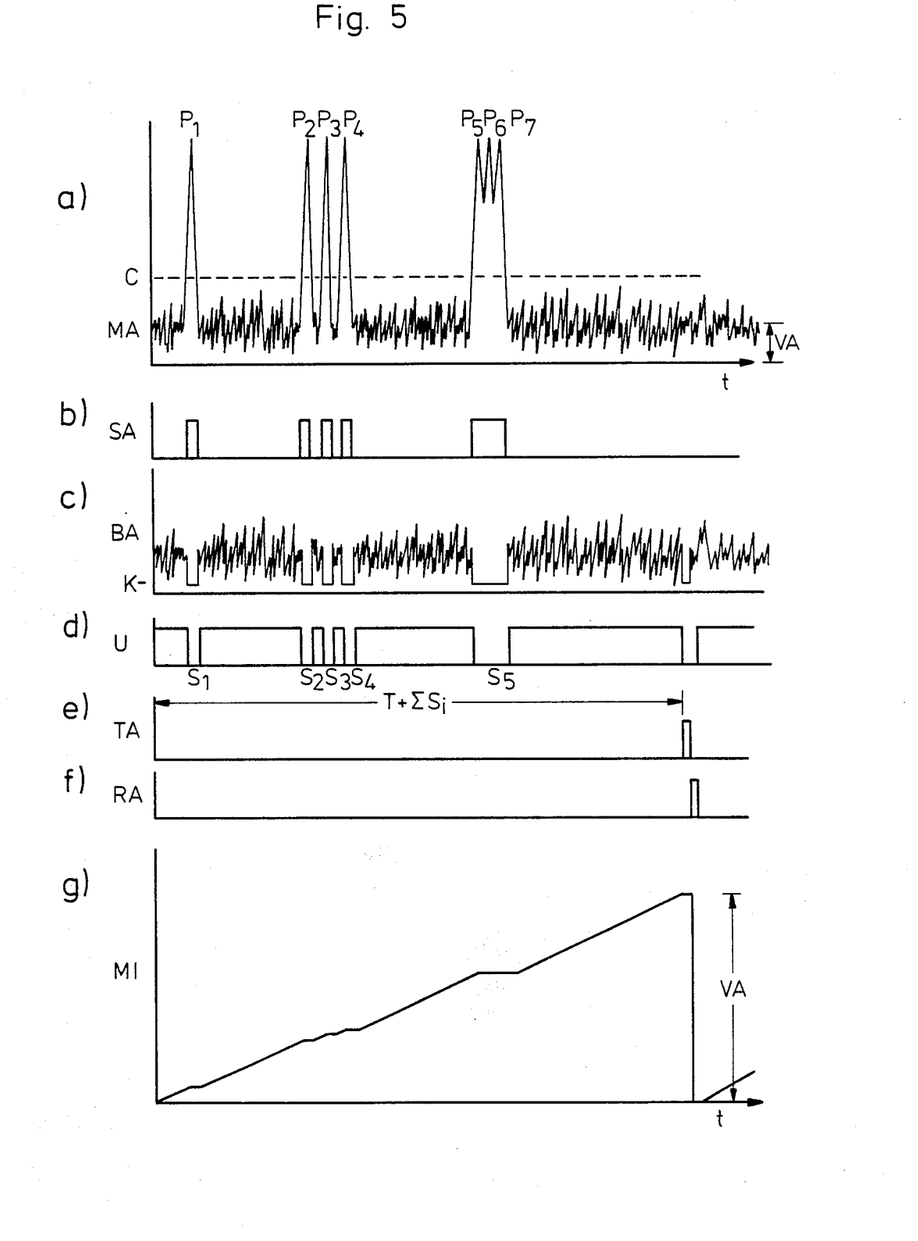

Analog signal MA may have a typical waveform as shown in FIG. 5a. Interference pulses $P_1$ to $P_7$ are to be detected and must not contribute to falsification of the measured value.

This becomes possible by comparing the instantaneous amplitude of signal MA with a threshold amplitude C (FIG. 5a).

Comparator and Signal Generator 12:

This unit compares the amplitudes of signals MA and C and generates a logic signal SA=1 (FIG. 5b) if MA>C, indicating that interference is present. If MA≦C, SA=0 and no interference exists.

The value of SA=1 can also be indicated optically or acoustically so as to be able to take suitable measures, if necessary, to suppress the interference.

Signal Generator 13 for Generating the Value C (threshold):

Purpose: in cases where measured value VA (FIG. 5a) will change only slightly, unit 13 may be composed of a potentiometer by which signal C can be permanently set on the basis of empirical values. This case is shown in FIG. 5a. If, however, VA changes, and does so with time constants which are large compared to the time constants at which the interferences $P_1$ to $P_7$ appear, this must be considered in the generation of C. In such a case, signal C is generated from measurement signal MA by filtering through a lowpass filter with a time constant $\tau$, and by subsequent amplification.

Figure 6:
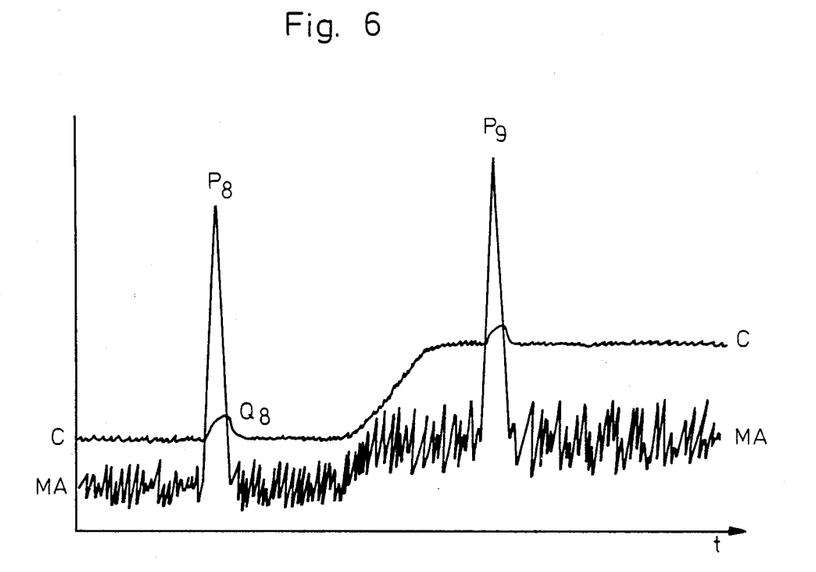
FIG. 6 is a waveform diagram further illustrating the operation of the circuit of FIG. 4.

An example of the behavior of MA and C in this case is illustrated in FIG. 6. If measured value VA remains constant (practically the average value without any interference), C also remains constant with a low statistical interference amplitude. The gain of the lowpass filtered signal determines how high C is relative to VA. If interference occurs in the form of a peak $P_8$, a smaller peak $Q_8$ also occurs in signal C. But this does not impair the function of comparator 12 so that further processing remains unchanged.

If now measurement signal MA increases, value C follows with a certain delay determined by $\tau$. Time constant $\tau$ must be set in such a way that, on the one hand, the statistical noise in MA is noticeably reduced and, on the other hand, the delay between signals MA and C does not become too large. The interference in signal MA obtained from skin blood flow measurements mentioned above correspond to time constants of about $\mathcal{A}$s. The natural change of the mean blood flow occurs in the order of 30s. Therefore, a time constant $\tau \approx \mathcal{A}$0s is appropriate.

If now interference $P_9$ occurs while MA is at the higher level, it can be detected as before. If value C did not change, interference could not erroneously be indicated all the time since now MA has the same magnitude as original threshold C.

Signal C can also be generated in that signal BA, freed from interference and appearing at the output of switch 17, or measured value VA is used as the basis. FIG. 4 shows the transfer of signal BA to unit 13. Compared to the utilization of VA, this has the advantage that threshold C is able to react faster to changes in the measurement signal. Signal BA which is fed to unit 1 corresponds to signal VV of FIG. 1.

Unit 2 in FIG. 4 forms the measured value VA by integrating measurement signal MA over those time intervals during which no interference SA=1 is indicated.

Switch 17:

Purpose: when no interference occurs, switch 17 is in the position shown, in which measurement signal MA is present at the input of integrator 14 (BA=MA) (FIGS. 5a and 5c). If a signal DA is present, which will occur if interference exists, or end of a measuring interval, switch 17 is connected to terminal K providing a voltage (see FIG. 5c) of such magnitude that the output value MI of integrator 14 remains constant during the interferences periods SA or at the time of transfer of the measured value when a logic signal TA=1 is present (see FIG. 5g). Output signal BA is shown in FIG. 5c.

Clock 15:

Clock 15 permits setting of measuring period T. The time sequence is interrupted during interference SA=1, i.e. during $S_1$ to $S_5$ (FIG. 5d). At the end of measuring period T, i.e. at the end of time $$T + \sum_i S_i$$

(FIG. 5e), the time sequence is interrupted and signals TA and RA are generated in a time sequence which assures the correct transfer of measured value VA from integrator 14 to memory 16 (FIGS. 5e, 5f). Then the clock is reset to 0. The times during which the clock runs is indicated as U=1 in FIG. 5d.

Integrator 14:

The unit integrates signal BA with a time constant which is large compared to the fluctuations occurring in BA. Output signal MI is shown in FIG. 5g. If RA=1, integrator 14 is reset to zero.

Memory 16 (Sample & Hold):

If signal TA=1 is present, unit 16 records the momentary value of signal MI, transfers it to the circuit output as signal VA and keeps it constant there until a further signal TA=1 appears (FIG. 5g). This causes VA to remain constant during the following measuring interval and it can be read out, for example, or processed further.

OR Stage 18:

Stage 18 generates signal DA if there is either interference (SA=1) or a transfer of measured values (TA=1).

The advantage of this method in the above exemplary embodiment is that the quality of the noised and interference interruption corresponds to the use of a large time constant during lowpass filtering or integration (FIG. 7b and 7c, and FIG. 5g).

In contrast to these known methods, however, a measured value is generated which is not falsified by interference and which, moreover, is able to vary to a certain degree.

What is claimed is:

1. A method for indicating the value of a time varying measurement signal which may contain interference that would lead to a systematic error in the value indication, which method includes:

providing a representation of the measurement signal;

providing a representation of a threshold value with respect to which the representation of the measurement signal has a given polarity when interference is present in the measurement signal;

identifying each time period during which the measurement signal representation has the given polarity relative to the threshold value representation; and producing an indication of the value which the measurement signal has outside of each identified time period in response to the value of the measurement signal during a time interval having a duration equal to the sum of a fixed period and each identified time period occurring during the time interval.

2. A method as defined in claim 1 wherein said step of providing a representation of a threshold value is carried out by deriving a threshold value representation at a given point in time on the basis of the indication of the value of the measurement signal produced at a time preceding the given point in time.

3. A method as defined in claim 1 wherein said step of producing an indication includes suppressing the measurement signal representation during each identified time period.

4. In a method for indicating the value of a time varying measurement signal which may contain interference that would lead to a systematic error in the value indication, which method includes:
providing a representation of the measurement signal;
providing a representation of a threshold value with respect to which the representation of the measurement signal has a given polarity when interference is present in the measurement signal;
identifying each time period during which the measurement signal representation has the given polarity relative to the threshold value representation; and
producing an indication of the value which the measurement signal has outside of each identified time period; the improvement wherein:
the measurement signal is in the form of a response of pulses, the value of the measurement signal is a function of the time between successive pulses, and the threshold value is a selected minimum time interval; and
said step of providing a representation of a threshold value includes deriving a threshold value representation at a given point in time on the basis of an average time between successive pulses represented by the indication of the value of the measurement signal produced at a time preceding the given point in time.

5. In a method for indicating the value of a time varying measurement signal which may contain interference that would lead to a systematic error in the value indication, which method includes:
providing a representation of the measurement signal;
providing a representation of a threshold value with respect to which the representation of the measurement signal has a given polarity when interference is present in the measurement signal;
identifying each time period during which the measurement signal representation has the given polarity relative to the threshold value representation; and
producing an indication of the value which the measurement signal has outside of each identified time period; the improvement wherein:
the measurement signal is in the form of a response of pulses, the value of the measurement signal is a function of the time between successive pulses, and the threshold value is a selected minimum time interval; and
said step of producing an indication includes counting the number of pulses in the sequence during a selected interval and interrupting the count during each identified time period.

6. A method for indicating the value of a time varying measurement signal which may contain interference that would lead to a systematic error in the value indication, which method includes:
providing a representation of the measurement signal, with the representation being an analog signal having a time varying amplitude;
providing a representation of a threshold value with respect to which the representation of the measurement signal has a given polarity when interference is present in the measurement signal;
identifying each time period during which the measurement signal representation has the given polarity relative to the threshold value representation; and
producing an indication of the value which the measurement signal has outside of each identification time period, including integrating the measurement signal representation which occurs outside of each identified time period.

7. A method as defined in claim 6 wherein said step of providing a representation of a threshold value includes subjecting the measurement signal representation to lowpass filtering and subsequent amplification.

8. A method as defined in claim 6 wherein said step of providing a representation of a threshold value includes deriving the threshold value representation from the measurement signal value indication.

9. A method as defined in claim 6 wherein said step of integrating comprises producing an integration output signal and maintaining the integration output signal constant during each identified time period.

10. A method for indicating the value of a time varying measurement signal which may contain interference that would lead to a systematic error in the value indication, which method includes:
producing a measurement signal which is representative of the circulation of blood through body tissue and is constituted by the time behavior of a blood circulation speckle pattern;
providing a representation of the measurement signal;
providing a representation of a threshold value with respect to which the representation of the measurement signal has a given polarity when interference is present in the measurement signal;
identifying each time period during which the measurement signal representation has the given polarity relative to the threshold value representation; and
producing an indication of the value which the measurement signal has outside of each identified time period.

11. A method for indicating the value of a time varying measurement signal which is a function of light intensity and which may contain interference that would lead to a systematic error in the value indication, which method includes:
providing a representation of the measurement signal which is constituted by photon count pulses representative of the light intensity;
providing a representation of a threshold value with respect to which the representation of the measurement signal has a given polarity when interference is present in the measurement signal;
identifying each time period during which the measurement signal representation has the given polarity relative to the threshold value representation; and
producing an indication of the value which the measurement signal has outside of each identified time period.

* * * * *